US005506801A

United States Patent [19]
Tawel

[11] Patent Number: 5,506,801
[45] Date of Patent: Apr. 9, 1996

[54] HIGH-PERFORMANCE ULTRA-LOW POWER VLSI ANALOG PROCESSOR FOR DATA COMPRESSION

[75] Inventor: Raoul Tawel, Glendale, Calif.

[73] Assignee: California Institute of Technology, Pasadena, Calif.

[21] Appl. No.: 196,295

[22] Filed: Feb. 14, 1994

[51] Int. Cl.$^6$ ............................................. G06G 7/00
[52] U.S. Cl. .......................................................... 364/807
[58] Field of Search ...................................... 364/807, 602

[56] References Cited

U.S. PATENT DOCUMENTS

| 5,115,492 | 5/1992 | Engeler | 364/602 |
|---|---|---|---|
| 5,140,531 | 8/1992 | Engeler | 364/602 |
| 5,220,642 | 6/1993 | Takahashi et al. | 364/807 |
| 5,353,383 | 10/1994 | Uchimura et al. | 364/807 |

OTHER PUBLICATIONS

J. Lazzaro, S. Ryckebusch, M. A. Mahowald, and C. A. Mead, "Winner–Take–All Networks of O(N) complexity," Caltech Computer Science publication CS–TR–88–21, 1988.

R. M. Gray, "Vector Quantization", IEEE ASSP Magazine, April 1984. pp. 4–29.

Y. Linde, A. Buzo, and R. M. Gray, "An Algorithm for Vector Quantizer Design", IEEE Trans. on Commun., vol. COM–28, No. 1 Jan. 1980. pp. 84–95.

T. Delbruck, "Bump' Circuits for Computing Similarity and Dis–similarity of Analog Voltages," Proceedings of the International Neural Network Society, Seattle, Washington, 1991.

W. H. Equitz, "A New Vector Quantization Clustering Algorithm", IEEE Transactions on Acoustics, Speech, and Signal Processing, vol. ASSP–37, pp. 1568–1575, 1989.

C. Mead, "Analog VLSI and Neural Systems," Addison Wesley, Reading, Massachusetts, 1989, Chapter 6.

Primary Examiner—Tan V. Mai
Attorney, Agent, or Firm—Michael L. Keller; Michaelson & Wallace

[57] ABSTRACT

An apparatus for data compression employing a parallel analog processor. The apparatus includes an array of processor cells with N columns and M rows wherein the processor cells have an input device, memory device, and processor device. The input device is used for inputting a series of input vectors. Each input vector is simultaneously input into each column of the array of processor cells in a pre-determined sequential order. An input vector is made up of M components, ones of which are input into ones of M processor cells making up a column of the array. The memory device is used for providing ones of M components of a codebook vector to ones of the processor cells making up a column of the array. A different codebook vector is provided to each of the N columns of the array. The processor device is used for simultaneously comparing the components of each input vector to corresponding components of each codebook vector, and for outputting a signal representative of the closeness between the compared vector components. A combination device is used to combine the signal output from each processor cell in each column of the array and to output a combined signal. A closeness determination device is then used for determining which codebook vector is closest to an input vector from the combined signals, and for outputting a codebook vector index indicating which of the N codebook vectors was the closest to each input vector input into the array.

20 Claims, 7 Drawing Sheets

HIGH-PERFORMANCE ULTRA-LOW POWER VLSI ANALOG PROCESSOR FOR DATA COMPRESSION

ORIGIN OF THE INVENTION

The invention described herein was made in the performance of work under a NASA contract, and is subject to the provisions of Public Law 96-517 (35 USC 202) in which the contractor has elected to retain title.

BACKGROUND OF THE INVENTION

1. Technical Field

The invention relates to an apparatus for data compression, and more particularly, to such an apparatus employing a parallel analog processor.

2. Background Art

Data compression is the art of packing data. It is the process of transforming a body of data to a smaller representation from which the original or some approximation to the original can be retrieved at a later time. Most data sources contain redundancy like symbol distribution, pattern repetition, and positional redundancy. It is the role of the data compression algorithm to encode the data to reduce this built-in redundancy.

There are two kinds of data compression: lossless compression and lossy compression. Lossless compression guarantees that the data that is to be compressed and then subsequently decompressed, is identical to the original. Lossless data compression can be applied to any type of data. In practice, however, it is most common for textual data such as text, programming languages, object codes, data base information, numerical data, electronic mail etc., where it is important to preserve the original content exactly. Lossy data compression, on the other hand, allows the decompressed data to differ from the original data as long as the decompressed data can satisfy some fidelity criterion. For example, with image compression, it may suffice to have an image that subjectively looks to the human eye as good as the original. Likewise, in the case of compression of audio signals, it may suffice to have a reconstructed signal that merely sounds as good as the original to a user, rather than being an exact reproduction.

Data compression has not been a standard feature in most communication/storage systems for the following reasons: Compression increases the software and/or hardware cost; it is difficult to incorporate into high data rate systems (>10 Mb/s); most compression techniques are not flexible enough to process different types of data; and blocks of compressed data with unpredictable lengths present space allocation problems. These obstacles are becoming less significant today due to the recent advances in algorithm development, high-speed VLSI technology, and packet switching communications. Data compression, in certain restricted applications, is now a feasible option for those communication or storage systems for which communication bandwidth and/or storage capacity are at a premium.

Of the numerous algorithms present in image coding, vector quantization has been used as a source coding technique for both speech and images. It essentially maps a sequence of continuous or discrete vectors into a digital sequence suitable for communication over a digital channel or storage in a digital medium. The goal is to reduce the volume of the data for transmission over a digital channel and also for archiving to a digital storage medium, while preserving the required fidelity of the data. This is particularly important to many present and future communication systems, as the volume of speech and image data in the foreseeable future would become prohibitively large for many communication links or storage devices. A major obstacle preventing the widespread use of such compression algorithms, is the large computational burden associated with the coding of such images. It has been shown that a well-designed vector quantization scheme can provide high compression ratio with good reconstructed quality. Insofar lies the motivation for this work.

Unlike scalar quantization where the actual coding of continuous or discrete samples into discrete quantities is done on single samples, the input data of a vector quantization encoder are multi-dimensional blocks of data (input vectors). Therefore, in image coding, raw pixels are grouped together as input vectors for post-processing by the encoder, as seen in FIG. 1. Without loss of generality, we shall refer to gray scale images. However, as will be apparent to those skilled in the art, compression of color images is readily dealt with by extension. In FIG. 1, a fraction of a gray scale image is shown with a block of pixels highlighted. In this case the dimensionality of the pixel block is 4×4, which is a typical value for vector quantization. In the pre-processing stage, the intensity values corresponding to the pixels in this 4×4 block are raster scanned into a 16 element vector for post-processing by the encoder. An important technique in vector quantization is the training of the codebook prior to transmission. Extensive preprocessing is performed on sample source data to construct the codebook which will be used in the compression session. The classical codebook training scheme is the Lloyd-Buzo-Gray (LBG) algorithm, which is a generalized k-mean clustering algorithm. There are various other means for generating a codebook with lower complexity. These include codeword merging and codeword splitting algorithms. These algorithms trade off lower rate-distortion performance for faster code book generation. The encoder and decoder must first agree on the same codebook before data transmission. The closeness between an input vector and a codeword in the codebook is measured by an appropriate distortion function. During the compression session distortions between an input vector and codewords in the codebook are evaluated. The codeword closest to the input vector is chosen as the quantization vector to represent the input vector. The index of this chosen codeword is then transmitted through the channel. Compression is achieved since fewer bits are used to represent the codeword index than the quantized input data. The decoder receives the codeword index, and reconstructs the transmitted data using the pre-selected codebook.

The vector quantization algorithm which provides the foundation for the VLSI based hardware solution associated with the present invention will now be discussed. Consider a k-dimensional VQ encoder. The source image, say from an image data file or directly from a CCD array, is to be divided up into non-overlapping squares of p*p pixels. The pixel intensities for the block are subsequently put into a raster scan order, i.e. a k-dimensional input vector given by $$\vec{x} = (x_1, x_2, \ldots, x_k) \quad (1)$$

where k=p*p. The vector quantization encoder has an associated codebook C consisting of N precomputed codewords words given by:

$$C = C^{(1)}, C^{(2)}, \ldots, C^{(N)} \quad (2)$$

In practice, N is some power of 2, ranging typically from 128 to 256 or even 512 vectors for a large codebook with lots of detail. The N codewords are of course k-dimensional, i.e.

$$C^{(i)} = C_k^{(i)}, C_k^{(i)}, \ldots, C_k^{(i)} \qquad (3)$$

For an input vector $\vec{x}$, the encoder determines that codebook element $C^{(m)}$ such that $$d(X, C^{(m)}) \leq d(, C^{(n)}) \qquad (4)$$

for $1 \leq n \leq N$. The function $d(X, C^{(m)})$ is a distance metric, and the algorithmic goal is to find that codeword in the K dimensional space that is "closest" to the input vector. A common choice of the metric is the Euclidean distance metric, as given by $$d(X, C^{(m)}) = \frac{1}{K} \sum_{k=1}^{K} (x_k - c_k)^2 \qquad (5)$$

A more intuitive description of the problem is the following: For a k dimensional input vector consisting of bounded positive real-values and for a codebook consisting of N codewords, then the state space of the system is a k dimensional space populated by N unique vectors. The case for k=3 and N=6 is shown in FIG. 2. for illustrative purposes. The six stored codebook vectors are represented as filled points with indices $C^{(i)}$ in the 3 dimensional space. The input vector requiring classification is shown as the open point with index X. The role of the vector quantization encoder is to therefore select the physically closest codebook vector $C^{(i)}$ in the available space to the input vector X. The placement or selection of the locations of the codebook vectors is a part of the preprocessing stage and is outside the scope of this invention.

Once the encoder has determined the closest codeword for the given input kernel, all that remains is to either store or transmit the index m of the winning codeword. For a codebook consisting of N codewords, we require $\log_2 N$ bits. On the receiving end, the decoder's job is to replace the index m by $C^{(m)}$. Therefore, the coder achieves a compression ratio of $$\frac{Ks}{\log_2 N} \qquad (6)$$

where s is the number of bits per pixel. As an example, for an 8 bit/pixel gray scale image with a codebook size of 256 codewords, and using 16 dimensional kernels we achieve a compression ratio of 16.

In terms of the raw number of basic arithmetic operations (i.e. additions, multiplications, etc . . . ) required for each kernel classification, vector quantization is a very expensive algorithm to implement on a digital computer. There exist, however, techniques for pruning these prohibitive computational costs, but to date no such technique has lead to pseudo real-time image coding, hence the popularity of alternative coding schemes. Yet this very same repetitiveness of computations is indicative that the kernel classification task can be parallelized.

It is, therefore, an objective of the present invention to demonstrate how such a parallelization of the vector quantization algorithm was achieved.

In addition, it is another objective of the present invention to demonstrate how the parallelization of the vector quantization algorithm can be embodied in VLSI hardware.

SUMMARY OF THE DISCLOSURE

The foregoing problems are overcome in an apparatus for data compression employing a parallel analog processor. The apparatus includes an array of processor cells with N columns and M rows wherein the processor cells have an input device, memory device, and processor device. The input device is used for inputting a series of input vectors wherein each input vector in the series can represent a non-overlapped grouping of pixels of an image to be compressed. Each input vector is simultaneously input into each column of the array of processor cells in a pre-determined sequential order. An input vector is made up of M components, ones of which are input into ones of M processor cells making up a column of the array. In the case where an image is being compressed, each one of the input vector components represents an intensity of a particular pixel in the aforementioned grouping. The memory device is used for providing ones of M components of a codebook vector to ones of the processor cells making up a column of the array, such that a different such codebook vector is provided to each of the N columns of the array. The components of the codebook vector represent predetermined pixel intensities, if an image is being compressed. The processor device is used for simultaneously comparing the components of each input vector, whenever inputted, to corresponding components of each codebook vector in the respective columns of the array, and for outputting a signal representative of the closeness between the compared vector components.

The apparatus for data compression also includes a combination device and a closeness determination device. The combination device is used for combining the signal output from each processor cell in each column of the array and for outputting a combined signal for each column of the array. The closeness determination device is used for determining which codebook vector is closest to an input vector from the combined signals output by the combination device, and for outputting a codebook vector index indicating which of the N codebook vectors was the closest to the input vector for each input vector input into the array.

In a preferred embodiment of the present invention, the apparatus for data compression incorporates the capability to change the value of the codebook vector component provided by the memory device in each processor cell. This capability is realized by the addition of an array address generator device, library device, column and row decoder devices, and an access device. The array address generator device is used for outputting a series of array addresses wherein the series is made up of the array addresses of every processor cell in the array listed only once, and wherein the series is constantly repeated. The library device is used for storing the value of each codebook vector component for all the N codebook vectors and a corresponding array address of the processor cell associated with a particular codebook vector component, and for outputting the value of the codebook vector component corresponding to each array address received from the array address generator device. The column and row decoder devices are used for exclusively accessing the processor cell residing at an array address received from the array address generator device. And finally, the access device, which is disposed in each processor cell, is used for allowing the processor cell to be accessed by the column and row decoder device, such that a value of a codebook vector component received from the library device can be impressed on the memory device.

It is also preferred that the library device for storing the value of each codebook vector component for the N codebook vectors and a corresponding array address of the processor cell associated with a particular codebook vector component, further include a device for storing a plurality of N codebook vector sets such that a particular set of N codebook vectors whose associated components values are to be outputted can be selected in one of two ways. Either by a user, or automatically, in accordance with a predetermined selection criteria.

The preferred embodiment of the present invention, when used for image compression, further employs a voltage level proportional to the pixel intensity to represent the values of the components of the input and codebook vectors. To this end the memory device includes a capacitor for storing a voltage level representing the pixel intensity of the codebook vector component associated with the processor cell. In addition, the processor device includes a distance metric operation circuit for computing the degree of similarity between two voltages and outputting a current that becomes relatively large whenever the two voltages are very close together and substantially falls off the more dissimilar the two voltages are from each other. This provides a current which is indicative of the closeness of the two voltages representing the values of the components of the input and codebook vectors. The combination device can, therefore, be made by connecting the individual outputs of each processor cell in each column of processor cells to a single output line. The individual currents output from each processor cell in the column will combine, and so provide an indication of the closeness of the overall input vector to the codebook vector impressed on that column of processor cells. Because of this, the closeness determination device can include a winner-take-all circuit. This circuit determines which of the columns exhibits the highest current. The index of the codebook vector impressed on the "winning" column is then output.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

Figure 2:
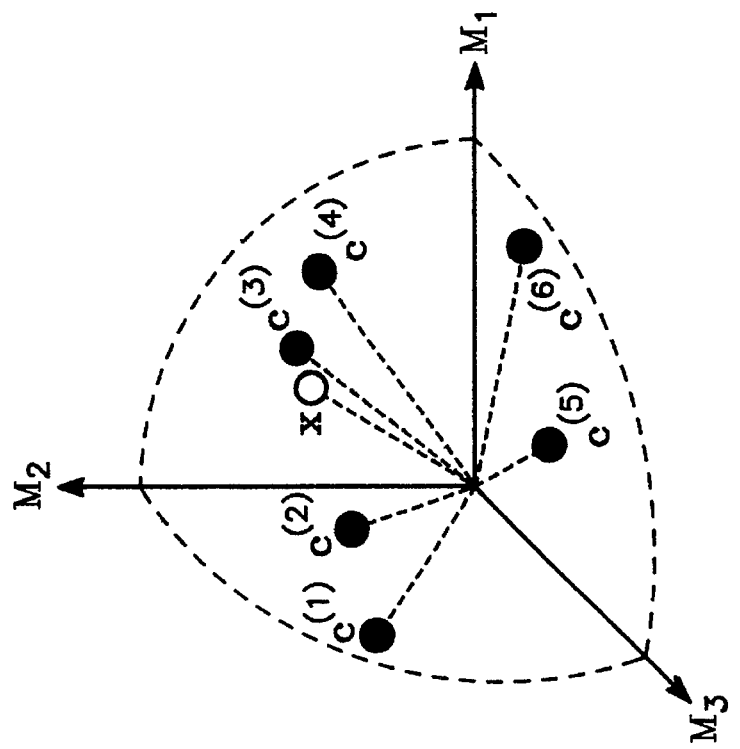
FIG. 2 is a diagram showing a positive real valued state space for the illustrative case of M=3. It shows locations of six precomputed codebook vectors $C^{(j)}$ along with a sample input vector x. In the example x is closest to $C^{(3)}$.
Figure 1:
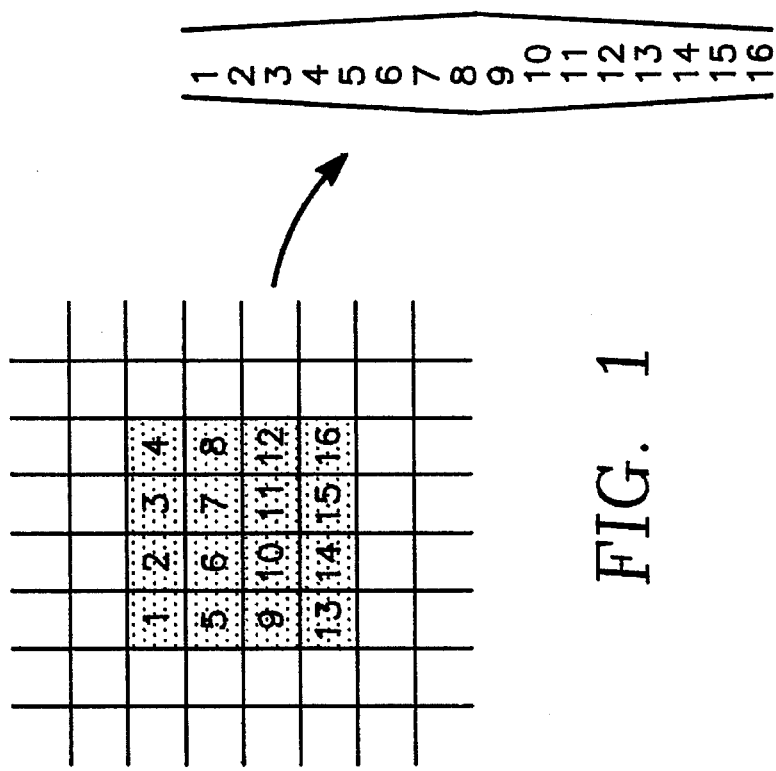
FIG. 1 is a diagram showing a pre-processing stage where pixel intensities in non-overlapping kernels from the original image are rearranged in vector form for post-processing by the vector quantization encoder.
Figure 3:
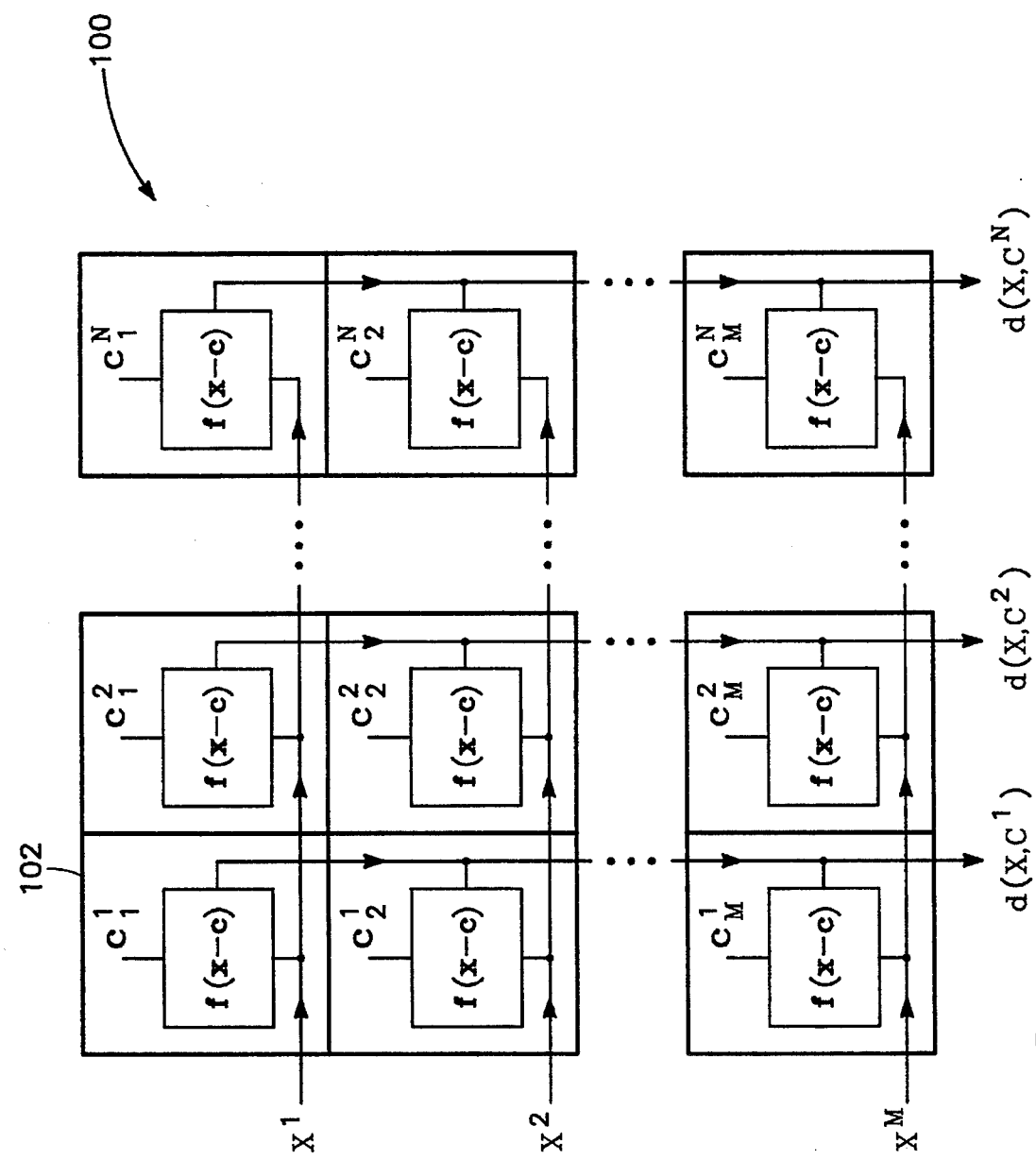
FIG. 3 is a diagram of a parallel architecture for the vector quantization encoder. Codebook vectors now occupy columns in the array structure, and input kernel vectors are broadcast simultaneously to all cells for computation.

The computational schematic for the parallel implementation of the vector quantization algorithm is shown in FIG. 3. It was required a priori that each kernel be compared to all stored codebook vectors in parallel (i.e. simultaneously). For an N size codebook, this would lead to an automatic speedup of the encoding task by a factor of N. Secondly, for each of the N such input-vector/codebook-vector comparisons, further speed improvements can be obtained by performing the distance metric operation across the M vector components in a fully parallel fashion. This entails calculating all M quantities of the metric operation $f(x_k - c_k)$ simultaneously and summing the result as the quantity $d(X, C^{(k)})$. For the Euclidean metric the function $f$ is the squaring function. This would lead to an additional speed-up by a factor of M. This formalism is shown schematically in FIG. 3, where each codebook vector now occupies a column in the array structure 100 shown. Each column consists of M computational cells 102 The codebook vector components $C_k^{(i)}$ form one of two inputs to the computational cell. The other input is the corresponding component of the incoming kernel vector $x^i$.

In actual practice N is some power of 2, say 256 or 512 codevectors for a good sized codebook. Each vector in the codebook is of dimension M, and one finds vectors of length 4, 9, 16 and 25. Recall that the length of a code vector is governed by the size of the pixel block requiring classification in the raw image. The computational schematic in FIG. 3 now provides us with the mechanism by which images may be encoded. The image to be compressed is partitioned into a sequence of nonoverlapping input kernels. The pixel intensities in each such kernel become the vector components of the input vector $\vec{x}$ which is applied to the vector quantization encoder processor, as seen by the quantities $x^M$. The array of cells 100 compute the metric operation as defined by $f$, and provide an output proportional to the distance between the vector components. A subsequent comparison of the M quantities $d(X, C^{(m)})$ points to the winning codebook vector. The address of this vector is the quantity required from the encoder. It should be noted that the parallelization of the vector quantization architecture has lead to an automatic speed-up of the encoding task by a factor of N*M. For our example of a 256 clement codebook with a kernel of dimension 16, this is a speed-up factor of 4096 over a serial implementation. Up to this point, no reference being made as to the medium for the implementation. All the above holds true for a N*M node Connection Machine or a N*M analog CMOS application specific processor.

Figure 4:
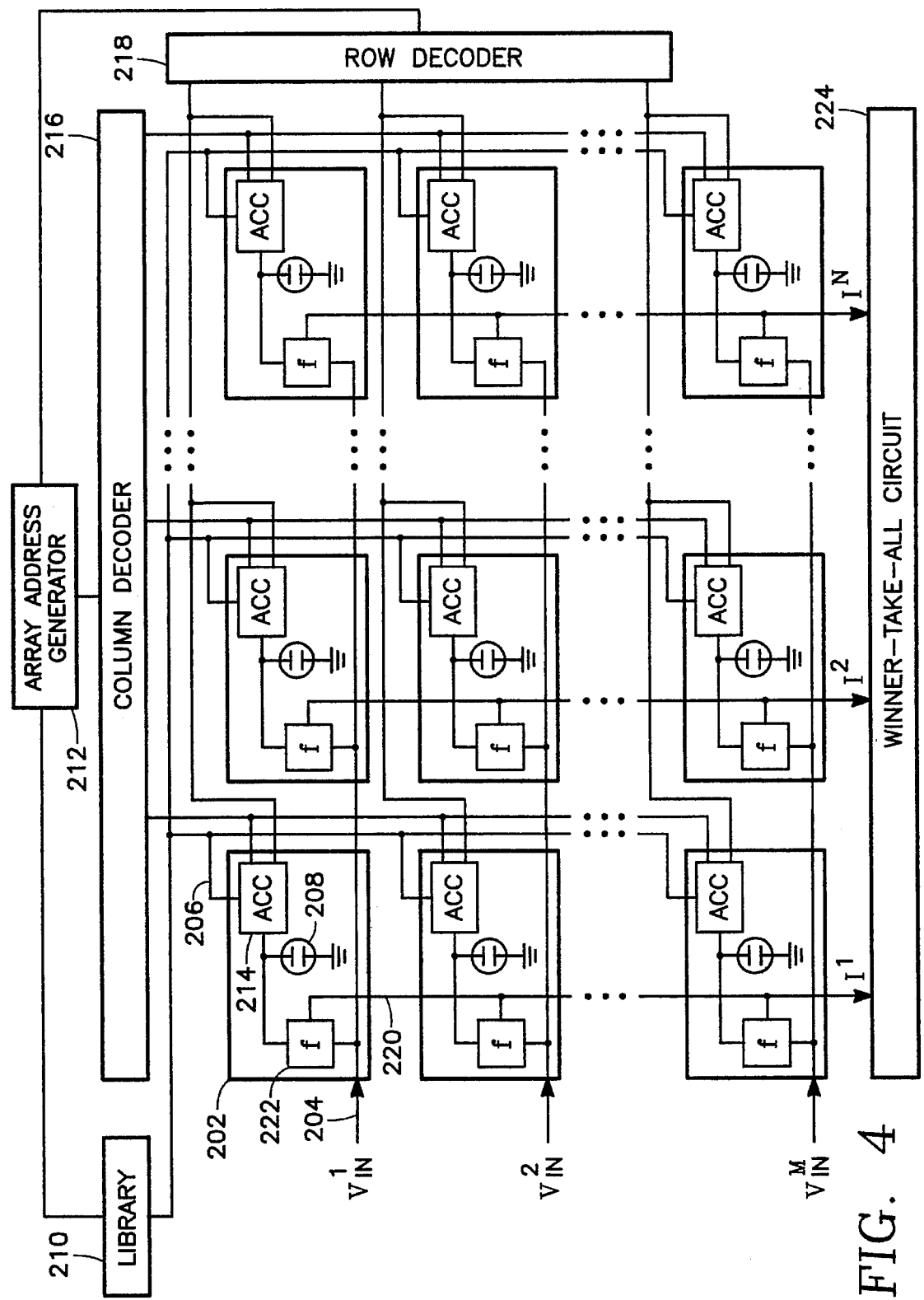
FIG. 4 is a simplified schematic of a circuit for the vector quantization encoder of FIG. 3. It includes (volatile) storage of codebook vectors as analog voltages on capacitors.

FIG. 4 is a preferred embodiment of the present invention and provides a practical electronic implementation of the computational paradigm described above. The array of computational cells 202 are identical to one another. Each computational cell 202 receives two scalar quantities and provides as an output a single scalar quantity. Exploiting the physics of the medium, input quantities 204 are voltages that can readily be broadcast across multiple cells 202. One such voltage, $V_{in}^i$ represents an incoming kernel pixel intensity, and as such, identical quantities need to be broadcast across all corresponding columns (codebook patterns). The second input 206 corresponds to a programming voltage line required to impress an externally controlled voltage on the built-in capacitors 208 in each cell. These capacitors provide for volatile) storage of the static/or time invariant) codebook vector components required for the computation. It should be recognized, that although capacitors are preferred, other devices capable of storing a voltage level could be employed. The second input 206 is supplied from a library 210 which stores the value of each codebook vector component for all the N codebook vectors and a corresponding array address of the computational cell 202 associated with a particular codebook vector component. It is also noted that the library 210 preferably has the capability to store more than one set of N codebook vectors, thereby allowing a user to choose which set to employ in the array. Alternately, the set to be employed could be chosen automatically via a predetermined selection criteria appropriate for the type of data being compressed. The library 210 outputs a signal having a voltage level consistent with the codebook vector component associated with an array address received from an array address generator 212. The array address generator 212 continuously repeats a series of array addresses where the series is made up of the address of each computational cell 202 in the array. In this way, the voltage level associated with each codebook vector component is impressed on the appropriate capacitor 208, and refreshed each time the series of addresses is repeated. The output of the library 210 is connected to every computational cell 202 in the array. To ensure the proper voltage is impressed on the capacitor 208 in each computational cell 202, each cell 202 has an access circuit 214. The access circuit 214 is connected to both a column decoder 216 and a row decoder 218. The column decoder 216 receives a column designation from the array address generator 212, and provides an activation signal to the access circuit 214 of each computational cell 202 in the designated column. Simultaneously, the row decoder 218 receives a row designation from the array address generator 212, and provides an activation signal to the access circuit 214 of each computational cell 202 in the designated row. The access circuit 214 of the computational cell 202 receiving both a column and row activation signal allows the signal from the library 210 to access the capacitor 208 and impress a voltage thereon. As described above, the voltage impressed will correspond to the codebook vector component associated with the address of the accessed cell 202. In this way the capacitors 208 of each computational cell 202 in the array are programmed to their preselected codebook values and subsequently refreshed during each cycle of the array address generator 212. The just-described library 210, array address generator 212, and column and row decoders 216, 218 can be implemented in any number of well known ways. For instance, a microprocessor could be programmed to perform these functions. However, as these elements do not make up novel aspects of the present and are achievable in well known ways, no detailed description is provided herein. The output, of the computational cell 202 is to a single line 220 on which a uni-directional current is broadcast. Summation of current contributions from cells along a given column is therefore achieved on a single wire 220. The specific role of the function block $f$ 222 within these computational cells 202 is to perform the distance metric operation between the two input scalar quantities 204, 206 as denoted by $V_{cap}^{ij}$, and $V_{in}^{j}$, (these being the $j^{th}$ elements of the $i^{th}$ code vector and the $j^{th}$ component of the input kernel, respectively). The output of each such computational cell 202 is a quantity proportional to the disparity between these two values. In our implementation, we chose the "bump" distance metric function $f$. This function computes the similarity between two voltages. The similarity output of this circuit is a current that becomes very large when the input voltages are very close together and falls off quasi-exponentially as the voltages are made more dissimilar. This functionality allows us to use a well known Winner-Take-All (WTA) module block 224 to determine the closest matching codebook vector. An example of this well known circuit is described in J. Lazzaro, S. Ryckebusch, M. A. Mahowald, and C. A. Mead, "Winner-Take-All Networks of O(N)Complexity," Caltech Computer Science publication CS-TR-88-21. Of course, as those skilled in the art will appreciate, many other comparison circuits are available which could be employed instead of the aforementioned "bump" circuit. For instance, a circuit implementing an absolute value or least squares approach could be used. A comparison circuit whose output decreases the closer the inputs are to each other could even be employed. Although in that case a "Loser-Take-All" circuit would have to be utilized to determine which codebook vector the input vector is closest too.

Figure 5:
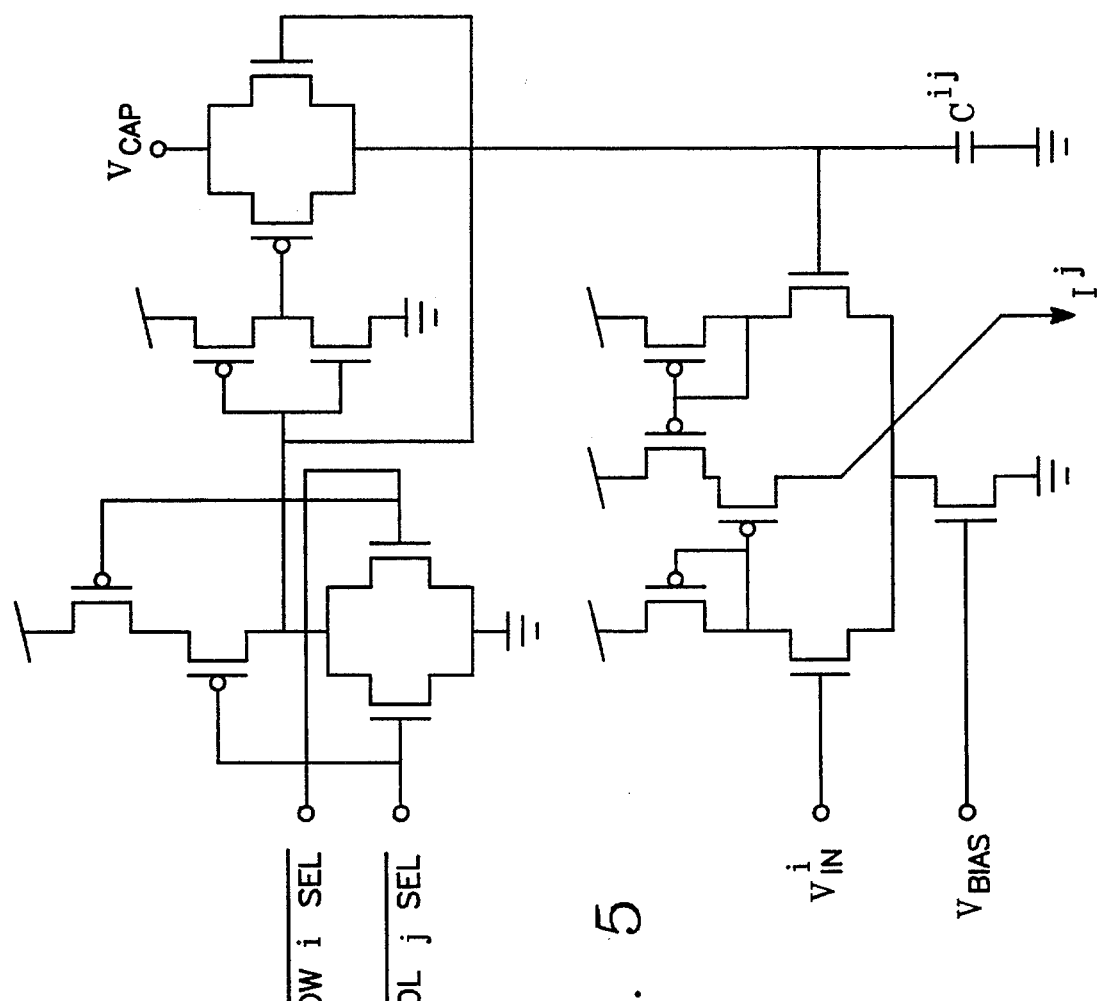
FIG. 5 is a simplified schematic of a circuit for the computational cells of FIG. 4. It includes a digital control logic circuit (upper circuit) and a "bump" comparator circuit (lower circuit).
Figure 6B:
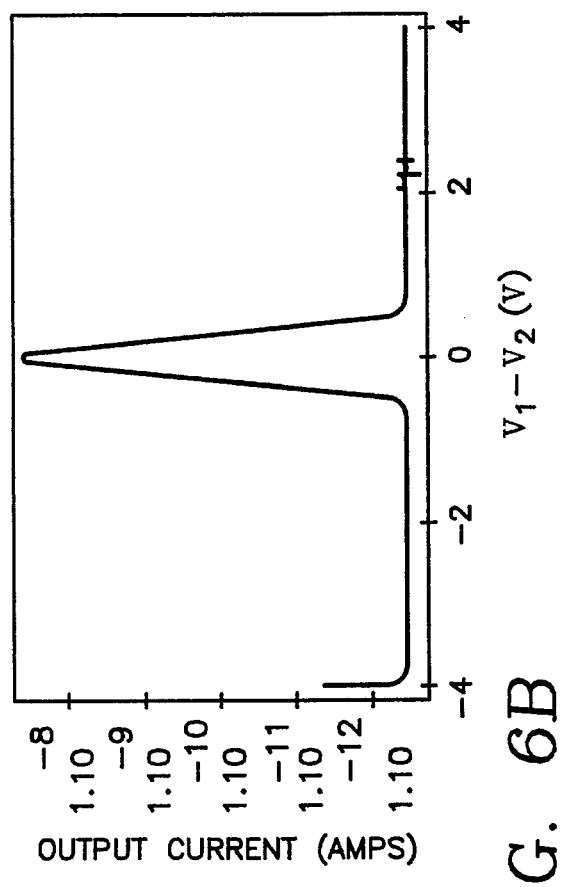
FIG. 6b is a graph showing a log/linear plot of the bell shaped response of the "bump" circuit.
Figure 6A:
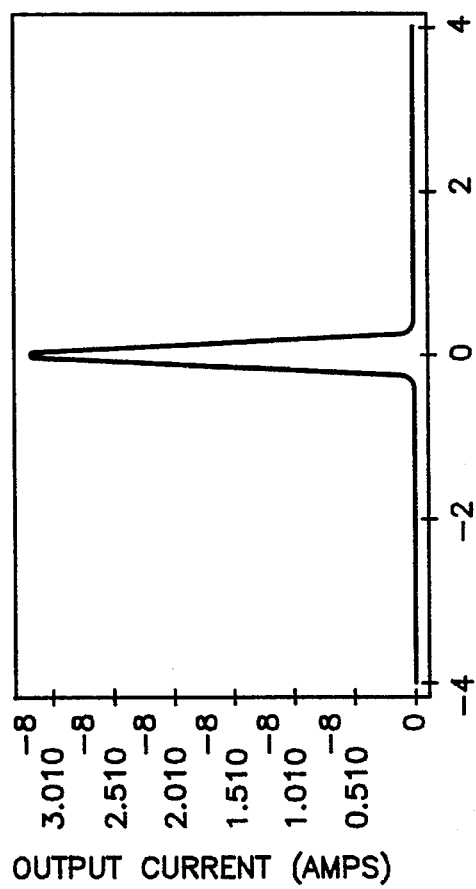
FIG. 6a is a graph showing a linear plot of the bell shaped response of the "bump" circuit.

A schematic of the preferred embodiment of the computational cells 202 is shown in FIG. 5. This circuit is particularly elegant in its simplicity. The upper portion of the figure contains the necessary address circuitry required impress a voltage and subsequently refresh this voltage on the capacitor $C^{ij}$. The lower portion of the figure contains the distance metric computational guts of the cell. This circuit, known as a "bump" circuit, and is well known in the art as exemplified by T. Delbruck, "Bump Circuits for Computing Similarity and Dissimilarity of Analog Voltages," Proceedings of the International Neural Network Society, Seattle, Wash., 1991. It essentially consists of a current correlator circuit hooked up to a differential pair. Its response is gaussian like and is given by $$I_{out} = \omega \frac{I_b}{2} \operatorname{sech}^2 \left( \frac{\kappa \Delta V}{2} \right) \tag{7}$$

where $\Delta V = (V_{in}^{j} - V_{cap}^{ij})$, $I_b$ is the bias current on the tail transistor, w is the transistor width to length ratio W:L, and $\kappa \approx 0.7$. This function is bell shaped and actual data points taken from the hardware are shown in FIGS. 6a and 6b. FIG. 6a shows the bell shaped curve plotted on a linear-linear scale, and FIG. 6b shows the same curve on a log-linear scale. The function is centered on $\Delta V = 0$ where it attains a maximum amplitude of $wI_b/2$. The operating conditions used were $V_{DD}=8$ V and $V_{SS}=0$ V. For the given bias current and cell, a peak current of 33 nA was obtained and a full width at half maximum (FWHM) of the peak of $\approx 0.2$ V. Although the peak centroid could be made to slide across the entire coding range of [1, 7] volts, the data shown was taken with a capacitor voltage of 4.04 V. It should be pointed out that the sensitivity on the voltage difference may be tuned (i.e. decreased or increased depending on the maximum output required by the winner-take-all stage) by changing the bias current to the gaussian circuit.

Figure 7:
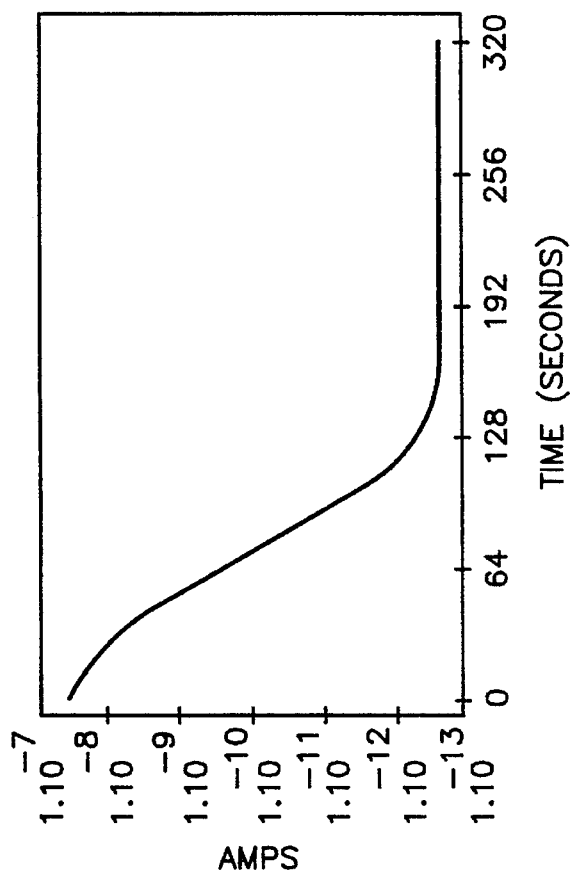
FIG. 7 is a graph showing a plot of the output current from the "bump" circuit as a function of time. The capacitor was initially charged to 4.04 V and disconnected from the outside world at t=0⁺. The plot is indicative of charge leakage from the capacitor.

From FIG. 6a and FIG. 6b, it can be seen that the distance function $f$ is extremely sensitive to small variations in input voltage differential. A valid concern in using capacitors for storing one of the voltage inputs to the metric function is the effect of charge leakage from the capacitor on the accuracy of the encoder. The size of the poly1-poly2 capacitors was set at 69×58 µm² for an effective capacitance of 2 pF. FIG. 7 shows indirectly the charge leakage off the capacitor by plotting the output current of the computational cell as a function of time, given that at $t=0^-$ the capacitor was charged to 4.04 V, and that at $t=0^+$ the capacitor was disconnected from the external voltage charge line and allowed to drift. From the figure, in ≈27 seconds, the output current changed by 24 nA. This corresponds to an effective change in capacitor voltage of ΔV=0.14 Volts. Correspondingly, we have a voltage drift rate of ΔV/Δt=5 mV/s. This implies that with a 12 bit D/A converter operating at ≈5 kHz, we should observe negligible effect on the accuracy of the encoder from charge decay.

Figure 8:
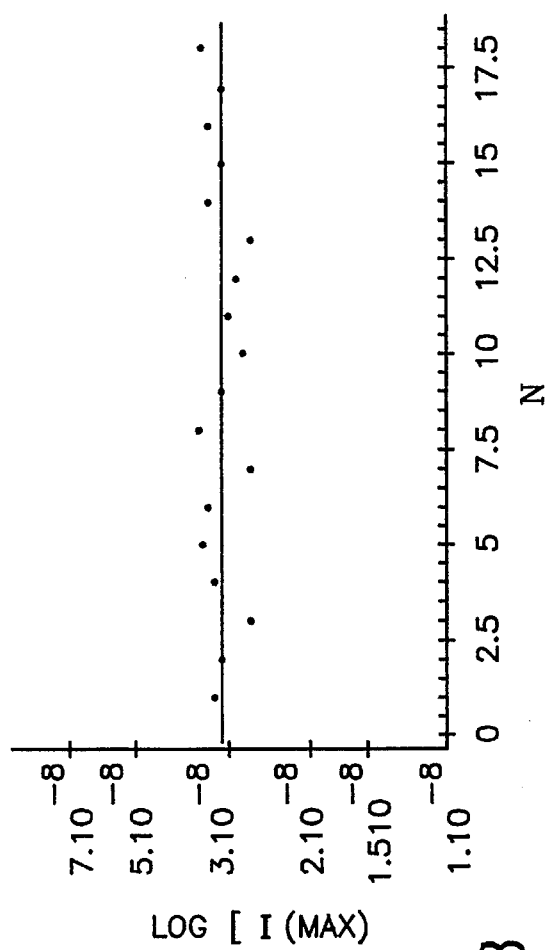
FIG. 8 is a graph showing a logarithmic plot of the intercell variation of peak current due to process variation.
Figure 9:
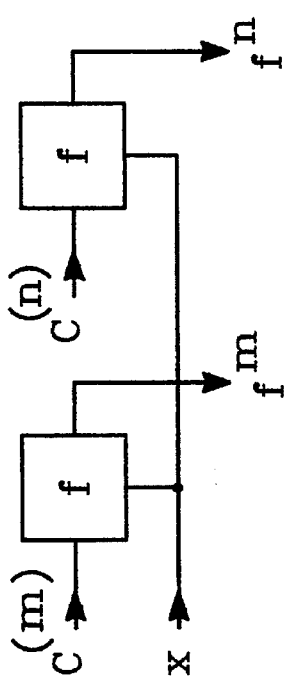
FIG. 9 is a diagram of a one dimensional encoder.

A further concern with analog computing is the effect of process variation on the computational stability of the VQ encoder. In FIG. 8, a statistical representation of the variation of the maximum current (i.e. the peak current) across 18 cells in the array is shown. For the given operating conditions, we have a mean $I_{max}$≈31.4 nA with a standard deviation of 3.5 nA. The range on $I_{max}$ across the cells was (27.2, 37.8) nA. The concern posed is the following: does the combination of process variation and exponential sensitivity on the part of the computational cell lead to classification problems? It turns out that there is really no problem. Consider a VAP processor of dimensionality M. This defines a real positive valued M dimensional state space for the system. Codebook vectors are points in this space. The question to ask now, is how close can two points be in this state space be to be resolved individually in view of the impact on $I_{max}$ caused by process variations? The worst case scenario is for M=1, as seen in FIG. 9. In this figure, we are given two very closely space patterns $C^{(m)}$ and $C^{(n)}$ such that $$C^{(m)}=C^{(n)}+\delta \qquad (8)$$

Figure 10:
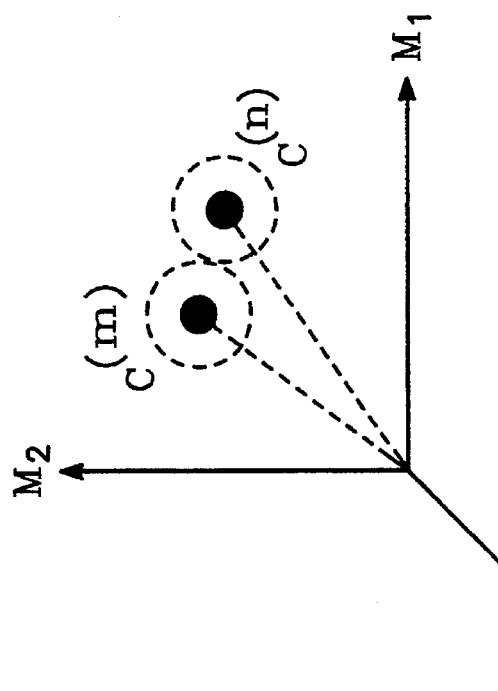
FIG. 10 is a diagram showing the positive real valued state space for the illustrative case of M=3 showing bubble regions surrounding codebook vectors.

Furthermore, lets assume that an input vector x is very close to $C^{(m)}$, i.e.

$$x \approx C^{(m)} \qquad (9)$$

then we can experimentally guarantee that the correct classification, i.e. that the following relationship holds $$f(x, C^{(m)}) > f(x, C^{(n)}) \qquad (10)$$

provided that δ≧0.1 Volt. This defines a bubble around each codebook vector in the state space seen in FIG. 10. On a coding range of [1, 7] Volts, this implies that we can load at most 60 distinct patterns in our one dimensional case. For the case M≧2, the same relationship holds in all dimensions. This means that for an M dimensional state space, there can be at most $60^N$ distinct resolvable states. For our 16 dimensional vector quantization problem, this implies that loading is complete after $10^{28}$ vectors.

A VLSI based analog chip capable of performing this vector quantization algorithm has been fabricated. This chip was designed as the Jet Propulsion Laboratory and fabricated through the MOSIS facilities in a 2 μm feature size process. Each chip was designed to be programmable (that is one can download a new set of codewords at will) and cascadable (so that libraries of several hundred/thousands of codewords may be stored. The chip is based on a capacitor refresh scheme, and consists of an address/data de-multiplexer, row and column address decoders, capacitor refresh circuitry, 16 analog input lines, winner select output lines, computational cells, and a WTA module. The WTA module is an adaptation of Lazzaro's Winner-Take-All analog network. The cells on the test chip are arranged in a 16×256 cross-bar matrix so that each of the N=256 columns are dedicated to the storage of a codebook patterns. Each column comprises M=16 cells, each of which performs the basic computation of t, he sum-squared disparity measurement.

For performance comparison, we have been able to compress a 512×512 pixel image in 0.5 seconds using a 256 element codebook and 16 element kernels. The same compression done in software on a SparcStation 2 was on the order of 200 seconds. This speed-up of 400 times was performed by a single VLSI chip at a fraction of the power (typically mW) and cost.

While the invention has been described by specific reference to preferred embodiments thereof, it is understood that variations and modifications thereof may be made without departing from the true spirit and scope of the invention. For instance, even though the foregoing discussion concentrated on the parallel implementaion of the vector quantization algorithm for image compression, it would be equally applicable to any type of data compression where some amount of data loss is acceptable.

What is claimed is:

1. A parallel analog processor for data compression, comprising:
   (a) an array of processor cells having N columns and M rows, each of said processor cells comprising,
      (a1) an input for inputting one of M components making up an input vector,
      (a2) memory means for providing one of M components making up one of N codebook vectors, and,
      (a3) processor means connected to the input and memory means for comparing an input vector component to a codebook vector component, and for outputting from an output of the processor cell a signal representative of the closeness between the compared vector components, and wherein,
      (a4) the inputs of each row of processor cells are connected together;
   (b) combination means for combining the signal output from each processor cell in each column of M processor cells and for outputting a combined signal for each column of processor cells; and,
   (c) closeness determination means for determining which codebook vector is closest to the input vector from the combined signals output by the combination means, and for outputting a codebook vector index indicating which of the N codebook vectors was the closest to the input vector.

2. The parallel analog processor of claim 1, further comprising:
   (a) array address generator means for outputting a series of array addresses wherein the series is made up of the array addresses of every processor cell in the array listed only once, and wherein the series is constantly repeated;
   (b) library means for storing the value of each codebook vector component for the N codebook vectors and a corresponding array address of the processor cell associated with a particular codebook vector component, and for outputting the value of the codebook vector component corresponding to each array address received from the array address generator means;
   (c) column and row decoder means for exclusively accessing the processor cell residing at an array address received from the array address generator means; and,
   (d) access means disposed in each processor cell for allowing the processor cell to be accessed by the column and row decoder means to cause a value of a codebook vector component received from the library means to be impressed on the memory means.

3. The parallel analog processor of claim 2, wherein the library means for storing the value of each codebook vector component for the N codebook vectors and a corresponding array address of the processor cell associated with a particular codebook vector component, further comprises:

means for storing a plurality of N codebook vector sets wherein a particular set of N codebook vectors whose associated components values are to be outputted is capable of being selected in one of two ways, (i) by a user, and (ii) automatically in accordance with a pre-determined selection criteria.

4. The parallel analog processor of claim 1, wherein:

(a) each component of the input vector represents an intensity of a pixel of an image to be compressed, and wherein the input vector comprises a grouping of said pixels; and, (b) each codebook vector component represents a pre-determined pixel intensity.

5. The parallel analog processor of claim 4, wherein values of the components of the input vector and codebook vector represent pixel intensity via a voltage level proportional to the pixel intensity, and wherein the memory means comprises:

a capacitor for storing a voltage level representing the pixel intensity of the codebook vector component associated with the processor cell.

6. The parallel analog processor of claim 5, wherein the processor means comprises a distance metric operation circuit means for computing the degree of similarity between two voltages and outputting a current that becomes relatively large whenever the two voltages are very close together and substantially falls off the more dissimilar the two voltages are from each other.

7. The parallel analog processor of claim 6, wherein the individual outputs of each processor cell in each column of processor cells are connected to a single output line to form the combination means.

8. The parallel analog processor of claim 7, wherein the closeness determination means comprises a winner-take-all circuit.

9. A method of data compression employing a parallel analog processor having an array of processor cells with N columns and M rows, comprising the steps of:

(a) inputting a series of input vectors wherein each input vector in the series is simultaneously input into each column of the array of processor cells in a pre-determined sequential order, said input vectors having M components, ones of which are input into ones of the M processor cells making up a column of the array;

(b) providing, via memory means disposed in each processor cell, ones of M components of a codebook vector to ones of the processor cells making up a column of the array, and providing a different such codebook vector to each of the N columns of the array;

(c) simultaneously comparing the components of each input vector, whenever inputted, to corresponding components of each codebook vector in the respective columns of the array, via processor means disposed in each processor cell, and outputting a signal representative of the closeness between the compared vector components;

(d) combining the signal output from each processor cell in each column of the array via combination means and outputting a combined signal for each column of the array; and, (e) determining which codebook vector is closest to an input vector from the combined signals output by the combination means via closeness determination means, and outputting a codebook vector index indicating which of the N codebook vectors was the closest to the input vector for each input vector input into the array.

10. The method of claim 9, further comprising the steps of:

(a) outputting a series of array addresses via an array address generator means wherein the series is made up of the array addresses of every processor cell in the array listed only once, and wherein the series is constantly repeated;

(b) storing the value of each codebook vector component for the N codebook vectors and a corresponding array address of the processor cell associated with a particular codebook vector component via library means, and outputting the value of the codebook vector component corresponding to each array address received from the array address generator means;

(c) exclusively accessing the processor cell residing at an array address received from the array address generator means via column and row decoder means; and, (d) allowing the processor cell to be accessed by the column and row decoder means via access means disposed in each processor cell to cause a value of a codebook vector component received from the library means to be impressed on the memory means.

11. The method of claim 10 wherein the step of storing the value of each codebook vector component for the N codebook vectors and a corresponding array address of the processor cell associated with a particular codebook vector component via library means, further comprising the step of:

storing a plurality of N codebook vector sets wherein a particular set of N codebook vectors whose associated components values are to be outputted is capable of being selected in one of two ways, (i) by a user, and (ii) automatically in accordance with a predetermined selection criteria.

12. The method of claim 9, wherein:

(a) each input, vector represents a non-overlapped grouping of pixels of an image to be compressed, and each component of the input vector represents an intensity of a particular pixel in the grouping; and, (b) each component of each codebook vector represents a pre-determined pixel intensity.

13. An apparatus for data compression employing a parallel analog processor, the apparatus comprising:

(a) an array of processor cells with N columns and M rows;

(b) input means for inputting a series of input vectors wherein each input vector in the series is simultaneously input into each column of the array of processor cells in a pre-determined sequential order, said input vectors having M components, ones of which are input into ones of M processor cells making up a column of the array;

(c) memory means disposed in each processor cell for providing ones of M components of a codebook vector to ones of the processor cells making up a column of the array, and wherein a different such codebook vector is provided to each of the N columns of the array;

(d) processor means disposed in each processor cell for simultaneously comparing the components of each input vector, whenever inputted, to corresponding components of each codebook vector in the respective columns of the array, and for outputting a signal representative of the closeness between the compared vector components;

(e) combination means for combining the signal output from each processor cell in each column of the array and for outputting a combined signal for each column of the array; and, (f) closeness determination means for determining which codebook vector is closest to an input vector from the combined signals output by the combination means, and for outputting a codebook vector index indicating which of the N codebook vectors was the closest to the input vector for each input vector input into the array.

14. The apparatus in accordance with claim 13, further comprising:

(a) array address generator means for outputting a series of array addresses wherein the series is made up of the array addresses of every processor cell in the array listed only once, and wherein the series is constantly repeated;

(b) library means for storing the value of each codebook vector component for the N codebook vectors and a corresponding array address of the processor cell associated with a particular codebook vector component, and for outputting the value of the codebook vector component corresponding to each array address received from the array address generator means;

(c) column and row decoder means for exclusively accessing the processor cell residing at an array address received from the array address generator means; and, (d) access means disposed in each processor cell for allowing the processor cell to be accessed by the column and row decoder means to cause a value of a codebook vector component received from the library means to be impressed on the memory means.

15. The apparatus in accordance with claim 14, wherein the library means for storing the value of each codebook vector component for the N codebook vectors and a corresponding array address of the processor cell associated with a particular codebook vector component, further comprises:

means for storing a plurality of N codebook vector sets wherein a particular set of N codebook vectors whose associated components values are to be outputted is capable of being selected in one of two ways, (i) by a user, and (ii) automatically in accordance with a pre-determined selection criteria.

16. The apparatus in accordance with claim 13, wherein:

(a) each input vector represents a non-overlapped grouping of pixels of an image to be compressed, and each component of the input vector represents an intensity of a particular pixel in the grouping; and, (b) each component of each codebook vector represents a pre-determined pixel intensity.

17. The apparatus in accordance with claim 16, wherein values of the components of the input vector and codebook vector represent pixel intensity via a voltage level proportional to the pixel intensity, and wherein the memory means comprises:

a capacitor for storing a voltage level representing the pixel intensity of the codebook vector component associated with the processor cell.

18. The apparatus in accordance with claim 17, wherein the processor means comprises a distance metric operation circuit means for computing the degree of similarity between two voltages and outputting a current that becomes relatively large whenever the two voltages are very close together and substantially falls off the more dissimilar the two voltages are from each other.

19. The apparatus in accordance with claim 18, wherein the individual outputs of each processor cell in each column of processor cells are connected to a single output line to form the combination means.

20. The apparatus in accordance with claim 19, wherein the closeness determination means comprises a winner-take-all circuit.

* * * * *